(12) United States Patent
Feroli et al.

(10) Patent No.: US 8,964,398 B1
(45) Date of Patent: Feb. 24, 2015

(54) LOCKING / INDICATION SYSTEM

(75) Inventors: Lawrence J. Feroli, West Townsend, MA (US); Joseph P. King, Jr., Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 314 days.

(21) Appl. No.: 13/436,909

(22) Filed: Mar. 31, 2012

(51) Int. Cl.
H05K 7/00 (2006.01)

(52) U.S. Cl.
USPC .............................. 361/747; 361/756; 361/754

(58) Field of Classification Search
USPC ......... 361/726–732, 686, 747, 754, 756, 801, 361/802, 725, 679.37, 679.43, 679.58
See application file for complete search history.

(56) References Cited

U.S. PATENT DOCUMENTS

| | | | |
|---|---|---|---|
| 5,305,180 A * | 4/1994 | Mitchell et al. .......... | 361/679.37 |
| 5,379,184 A | 1/1995 | Barraza et al. | |
| 5,508,886 A | 4/1996 | Bernecker et al. | |
| 6,356,456 B2 * | 3/2002 | Eskildsen ..................... | 361/801 |
| 6,501,659 B1 | 12/2002 | Bodensteiner et al. | |
| 6,804,111 B1 | 10/2004 | Williams et al. | |
| 7,046,517 B2 | 5/2006 | Long et al. | |
| 7,239,522 B2 * | 7/2007 | Rust et al. ..................... | 361/732 |
| 7,251,143 B2 | 7/2007 | Magnoux et al. | |
| 7,272,012 B2 | 9/2007 | Salinas et al. | |
| 7,304,855 B1 | 12/2007 | Milligan et al. | |
| 7,599,176 B1 | 10/2009 | Moisson | |
| 7,679,899 B2 * | 3/2010 | Hsieh et al. ............. | 361/679.38 |
| 8,107,247 B2 * | 1/2012 | Li et al. ......................... | 361/740 |
| 8,248,782 B2 * | 8/2012 | Tanaka et al. ............. | 361/679.5 |
| 8,503,182 B2 | 8/2013 | Petrick et al. | |
| 2003/0201902 A1 | 10/2003 | Post et al. | |
| 2004/0095731 A1 * | 5/2004 | Takada .......................... | 361/725 |
| 2007/0274053 A1 | 11/2007 | Salinas et al. | |

\* cited by examiner

*Primary Examiner* — Hung S Bui
(74) *Attorney, Agent, or Firm* — Brian J. Colandreo; Mark H. Whittenberger; Holland & Knight LLP

(57) ABSTRACT

A lockable infrastructure included a frame assembly, including a first portion of an electrical connector, configured for use within an IT infrastructure. A module assembly, including a second portion of the electrical connector, is configured to be removably positionable within the frame assembly. A locking system is configured to lock the module assembly within the frame assembly in one of a plurality of locked positions.

20 Claims, 9 Drawing Sheets

LOCKING / INDICATION SYSTEM

TECHNICAL FIELD

This disclosure relates to locking systems and, more particularly, to multi-positional locking systems.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are configured to be quickly inserted into and removed from various rack enclosures. Accordingly, hard drive modules, power supply modules, and computing modules may be configured to be quickly placed into and removed from frame assemblies.

SUMMARY OF DISCLOSURE

In a first implementation, a lockable infrastructure included a frame assembly, including a first portion of an electrical connector, configured for use within an IT infrastructure. A module assembly, including a second portion of the electrical connector, is configured to be removably positionable within the frame assembly. A locking system is configured to lock the module assembly within the frame assembly in one of a plurality of locked positions.

One or more of the following features may be included. The first portion of the electrical connector may be configured to releasably engage the second portion of the electrical connector and electrically couple the frame assembly to the module assembly when the module assembly is in a first of the plurality of locked positions. The first portion of the electrical connector may be configured to not releasably engage the second portion of the electrical connector and electrically isolate the frame assembly from the module assembly when the module assembly is in a second of the plurality of locked positions.

The frame assembly may include a portion of a standby power supply. The module assembly may include a battery. The locking system may include an engagement channel, wherein the engagement channel includes a plurality of lockable engagement points. The engagement channel may be incorporated into the module assembly. Each of the plurality of lockable engagement points may have a unique depth. The locking system may include a lever assembly, wherein the lever assembly is configured to releasably engage one or more of the plurality of lockable engagement points. The lever assembly may be incorporated into the frame assembly. The locking system may include a spring assembly for biasing the lever assembly. The locking system may include a release mechanism for disengaging the lever assembly from one or more of the plurality of lockable engagement points.

In another implementation, a lockable infrastructure includes a frame assembly, including a first portion of an electrical connector, configured for use within an IT infrastructure. A module assembly, including a second portion of the electrical connector, is configured to be removably positionable within the frame assembly. A locking system is configured to lock the module assembly within the frame assembly in one of a plurality of locked positions. The first portion of the electrical connector is configured to releasably engage the second portion of the electrical connector and electrically couple the frame assembly to the module assembly when the module assembly is in a first of the plurality of locked positions. The first portion of the electrical connector is configured to not releasably engage the second portion of the electrical connector and electrically isolate the frame assembly from the module assembly when the module assembly is in a second of the plurality of locked positions.

One or more of the following features may be included. The frame assembly may include a portion of a standby power supply. The module assembly may include a battery.

In another implementation, a lockable infrastructure includes a frame assembly, including a first portion of an electrical connector, configured for use within an IT infrastructure. A module assembly, including a second portion of the electrical connector, is configured to be removably positionable within the frame assembly. A locking system is configured to lock the module assembly within the frame assembly in one of a plurality of locked positions. The locking system includes: an engagement channel, wherein the engagement channel includes a plurality of lockable engagement points, and a lever assembly, wherein the lever assembly is configured to releasably engage one or more of the plurality of lockable engagement points.

One or more of the following features may be included. The engagement channel may be incorporated into the module assembly. Each of the plurality of lockable engagement points may have a unique depth. The lever assembly may be incorporated into the frame assembly. The locking system may include a spring assembly for biasing the lever assembly. The locking system may include a release mechanism for disengaging the lever assembly from one or more of the plurality of lockable engagement points.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
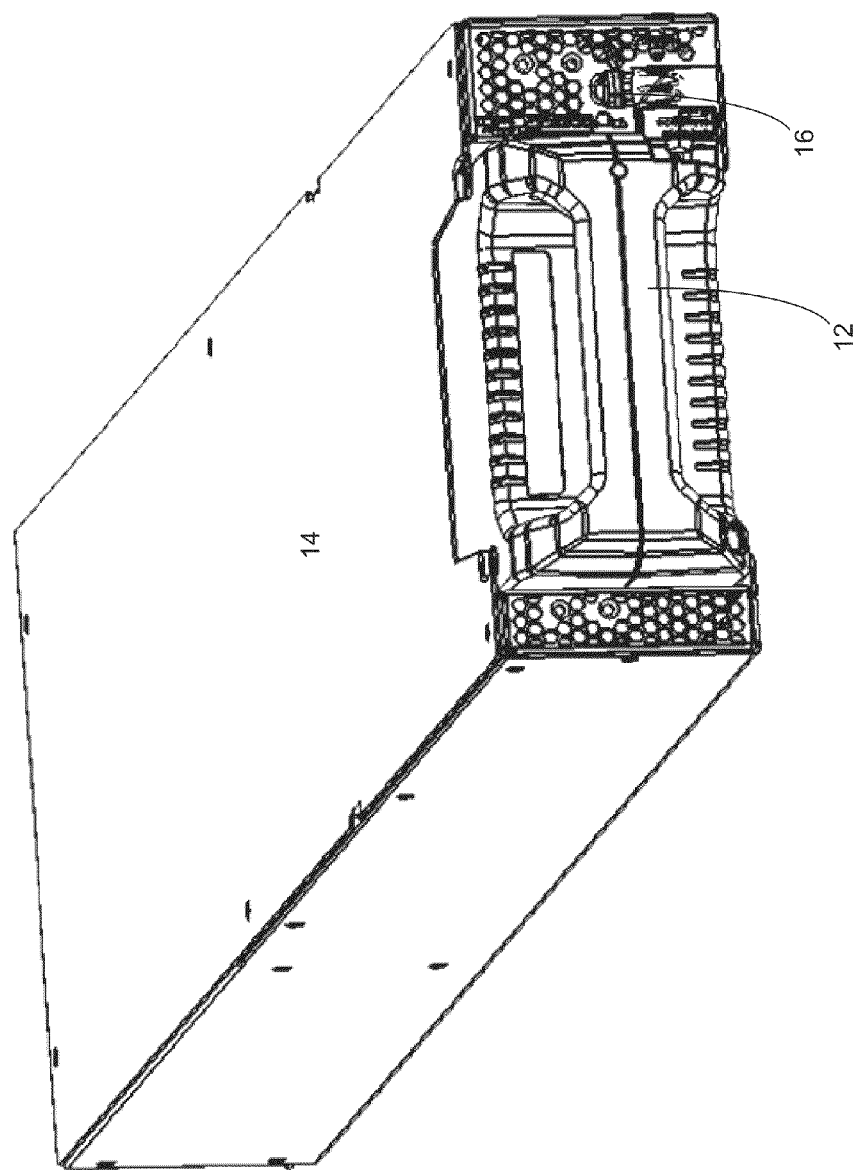
FIGS. 1-2 are diagrammatic views of a lockable infrastructure.
Figure 2:
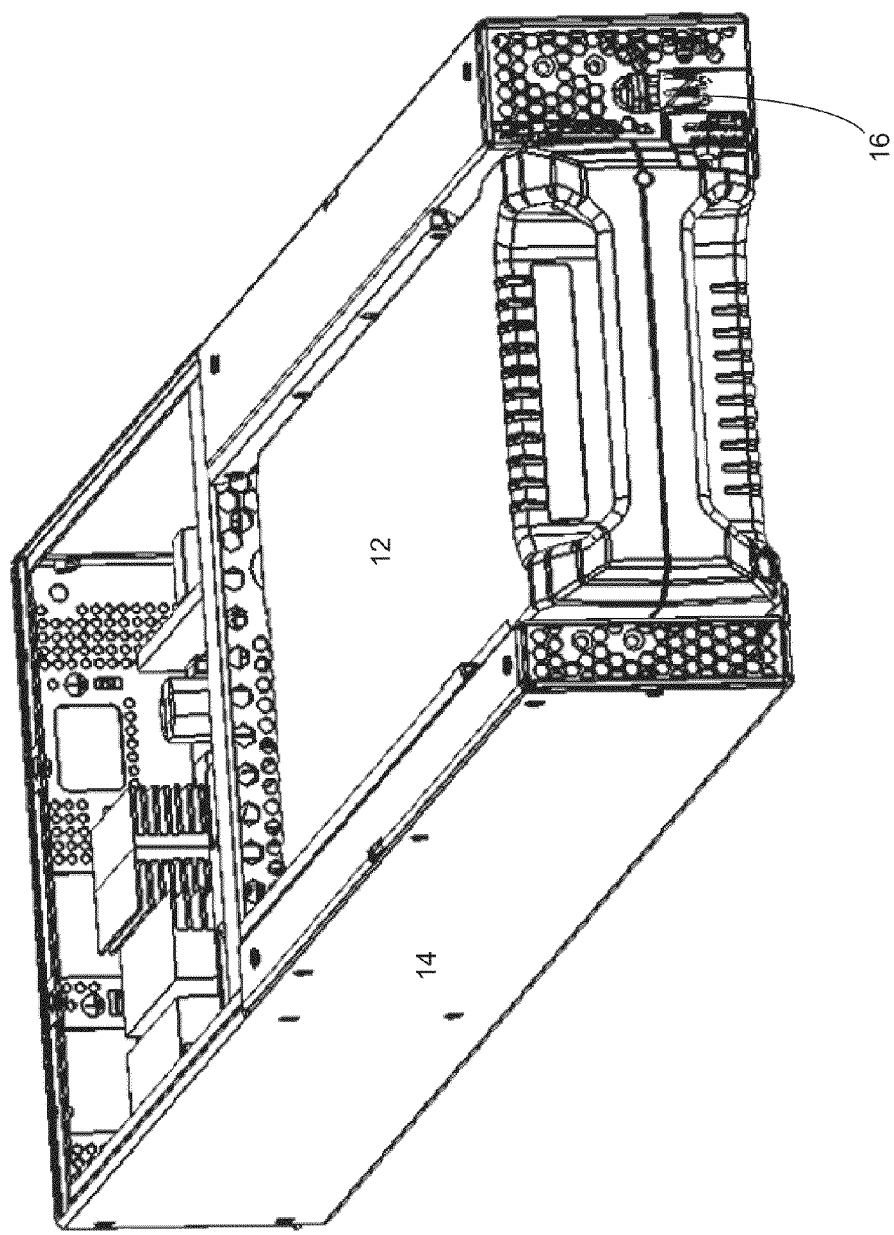
Figure 3:
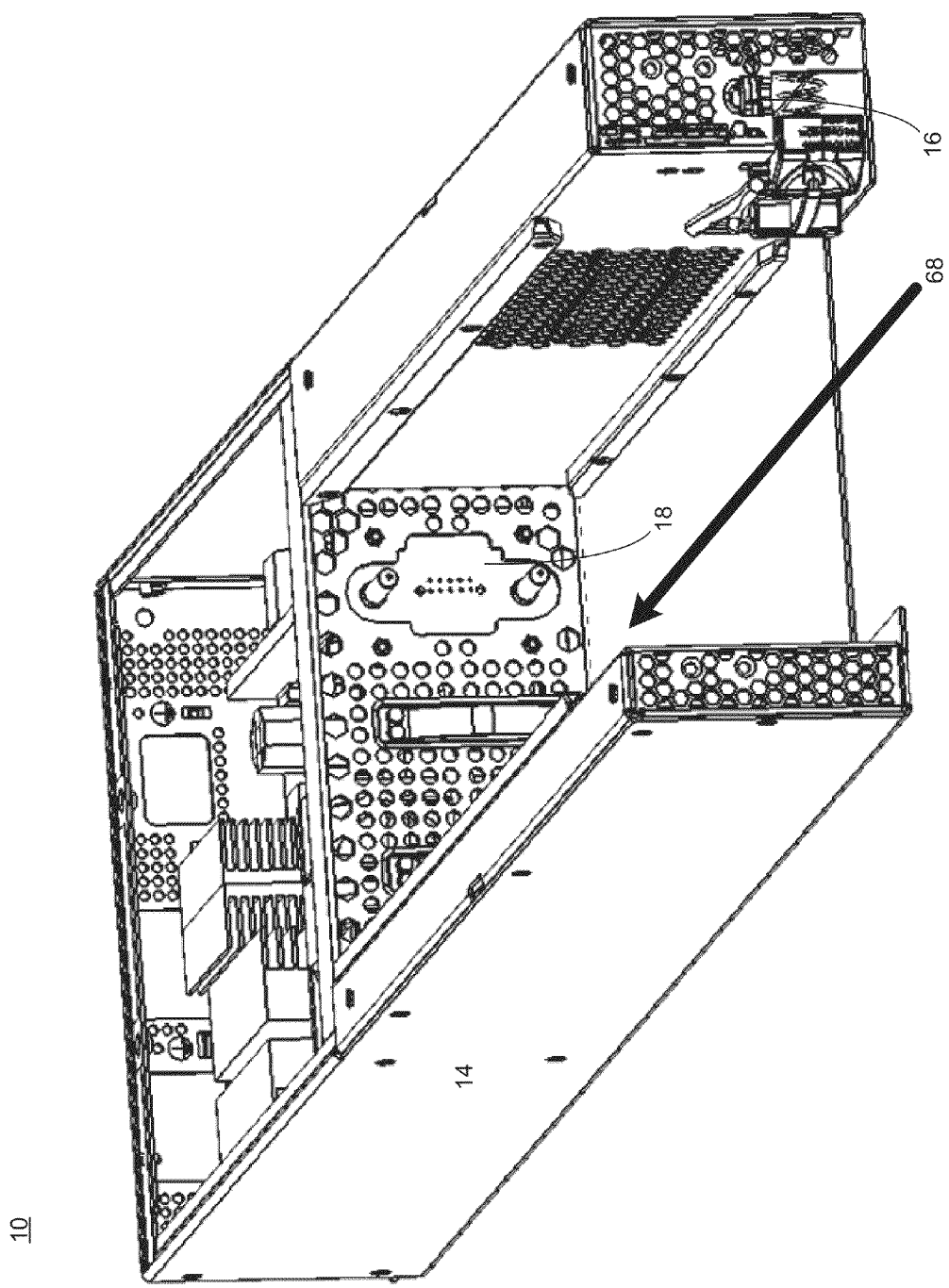
FIG. 3 is a diagrammatic view of a frame assembly of the lockable infrastructure of FIG. 1.
Figure 4:
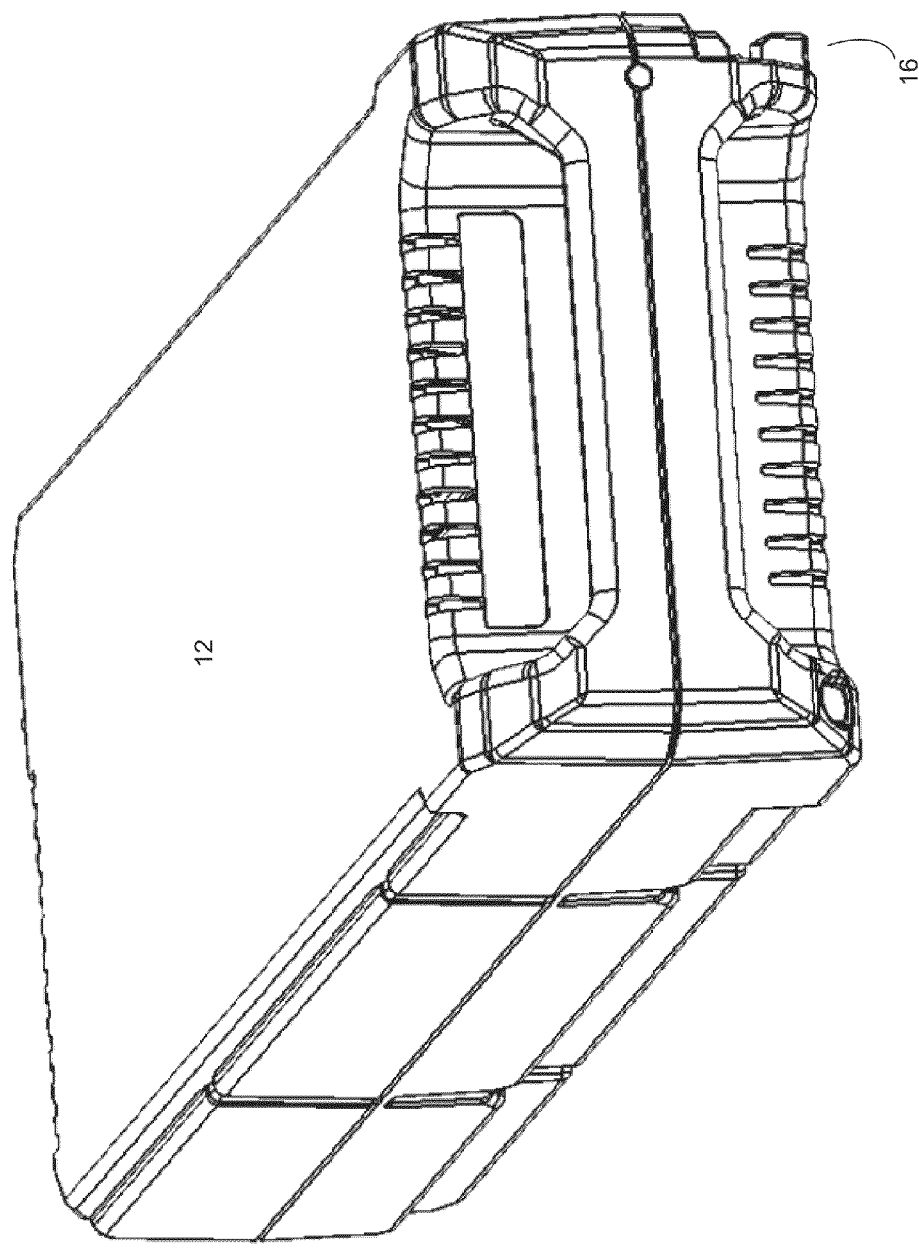
FIGS. 4-6 are diagrammatic views of a module assembly of the lockable infrastructure of FIG. 1.
Figure 5:
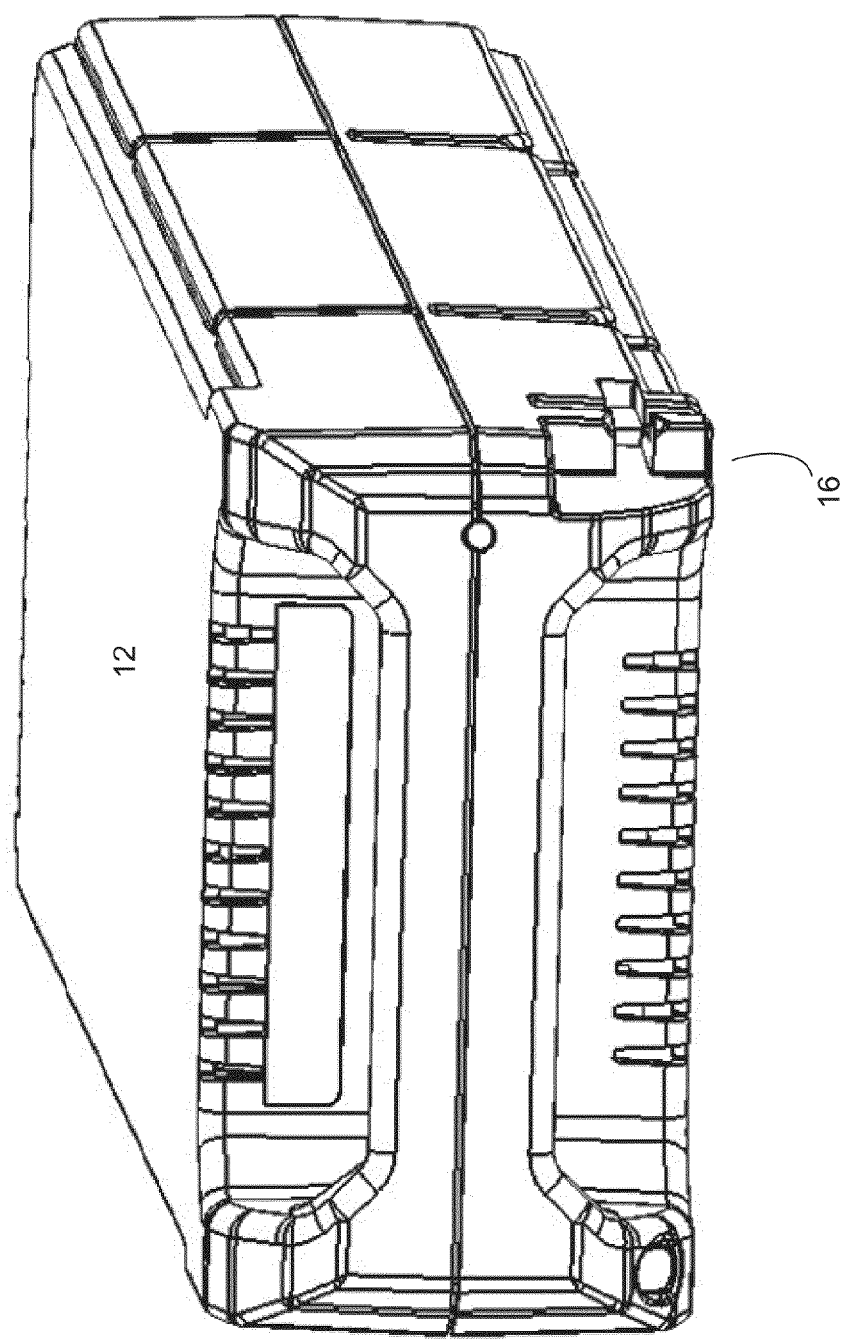
Figure 6:
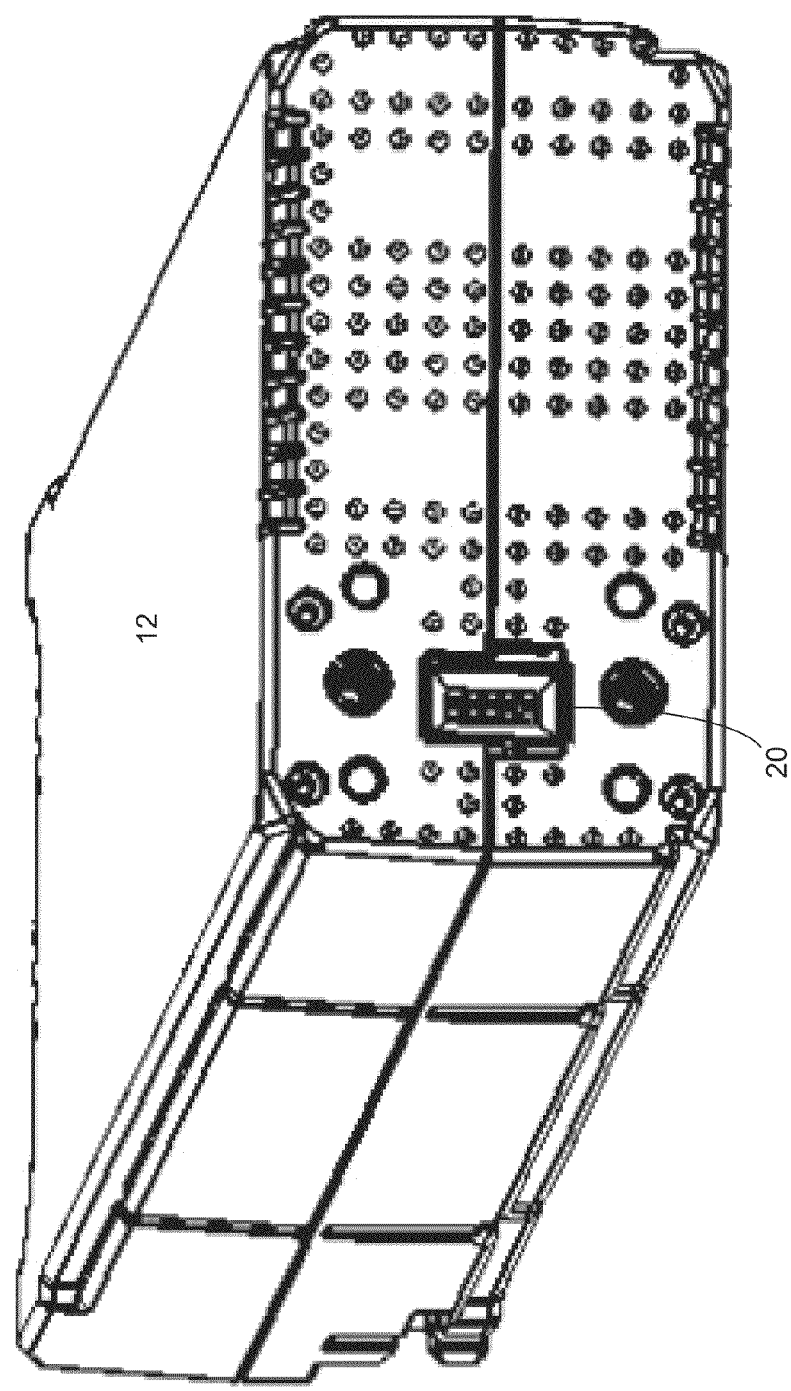

Referring to FIGS. 1-6, there is shown lockable infrastructure 10 that may include module assembly 12 and frame assembly 14, wherein module assembly 12 is removably positionable within frame assembly 14. Examples of frame assembly 14 may include but are not limited to frame assemblies that are capable of being mounted into IT cabinetry (e.g. racks, cabinets, enclosures). Examples of module assembly 12 may include but are not limited to various IT componentry that would be removably positionable within frame assembly 14, such as hard disk drive module assemblies, processing module assemblies, power supply module assemblies, and controller module assemblies.

Accordingly, frame assembly 14 may be configured as a portion of a standby power supply and module assembly 12 may include a battery and be configured to be removably coupleable to frame assembly 14. Alternatively, frame assembly 14 may be a storage subsystem and module assembly 12 may include a hard disk drive and be configured to be removably coupleable to frame assembly 14.

As module assembly 12 is configured to be repeatedly inserted into and removed from frame assembly 14, module assembly 12 and frame assembly 14 may be configured to include locking/indication system 16 that may allow for module assembly 12 to be locked into frame assembly 14 (i.e., at one of a plurality of locked positions), wherein e.g., a visual indication is provided to a user of lockable infrastructure 10 concerning the status of the locked position (as will discussed below in greater detail).

As lockable infrastructure 10 may be used in an IT environment, lockable infrastructure 10 may be configured so that there is electrical conductivity between module assembly 12 and frame assembly 14. Such electrical conductivity may be required so that e.g. power may be supplied to/received from module assembly 12 and/or data may be provided to/received from module assembly 12. Accordingly, frame assembly 14 may include first portion 18 of an electrical connector and module assembly 12 may include second portion 20 of the electrical connector, wherein portion 18, 20 may be releasably coupled to provide such electrical conductivity.

As will be discussed below in greater detail, locking/indication system 16 may be configured to lock module assembly 12 within frame assembly 14 in one of a plurality of locked positions. In one embodiment, locking/indication system 16 may be configured to lock module assembly 12 within frame assembly 14 in two positions, wherein the positions are essentially: A) module assembly 12 locked within frame assembly 14 (electrical coupling), and B) module assembly 12 locked within frame assembly 14 (no electrical coupling).

Accordingly, when lockable infrastructure 10 is locked in a first position (Position A, as described above) via locking/indication system 16, first portion 18 of the electrical connector (i.e., the portion on frame assembly 14) may be configured to releasably engage second portion 20 of the electrical connector (i.e., the portion on module assembly 12) so that frame assembly 14 and module assembly 12 are electrically coupled when module 12 assembly is locked in this first position (i.e., Position A).

Further, when lockable infrastructure 10 is locked in a second position (Position B, as described above) via locking/indication system 16, first portion 18 of the electrical connector (i.e., the portion on frame assembly 14) may be configured to NOT releasably engage second portion 20 of the electrical connector (i.e., the portion on module assembly 12) so that frame assembly 14 and module assembly 12 are NOT electrically coupled (and are actually electrically isolated) when module assembly 12 is locked in this second position (i.e., Position B).

Accordingly, by selecting a particular locking position, a user of lockable infrastructure 10 may be able to select whether or not frame assembly 14 and module assembly 12 are electrically coupled when module assembly 12 is locked within frame assembly 14. Such a configuration may provide advantages during certain situations. For example, if module assembly 12 is a battery that is shipped from the factory fully charged, it might be beneficial to lock module assembly 12 within frame assembly 14 in the second position (i.e., Position B) so that module assembly 12 receives the benefit of being secured within frame assembly 14 without the potential problems of being electrically coupled together during shipment.

Figure 7:
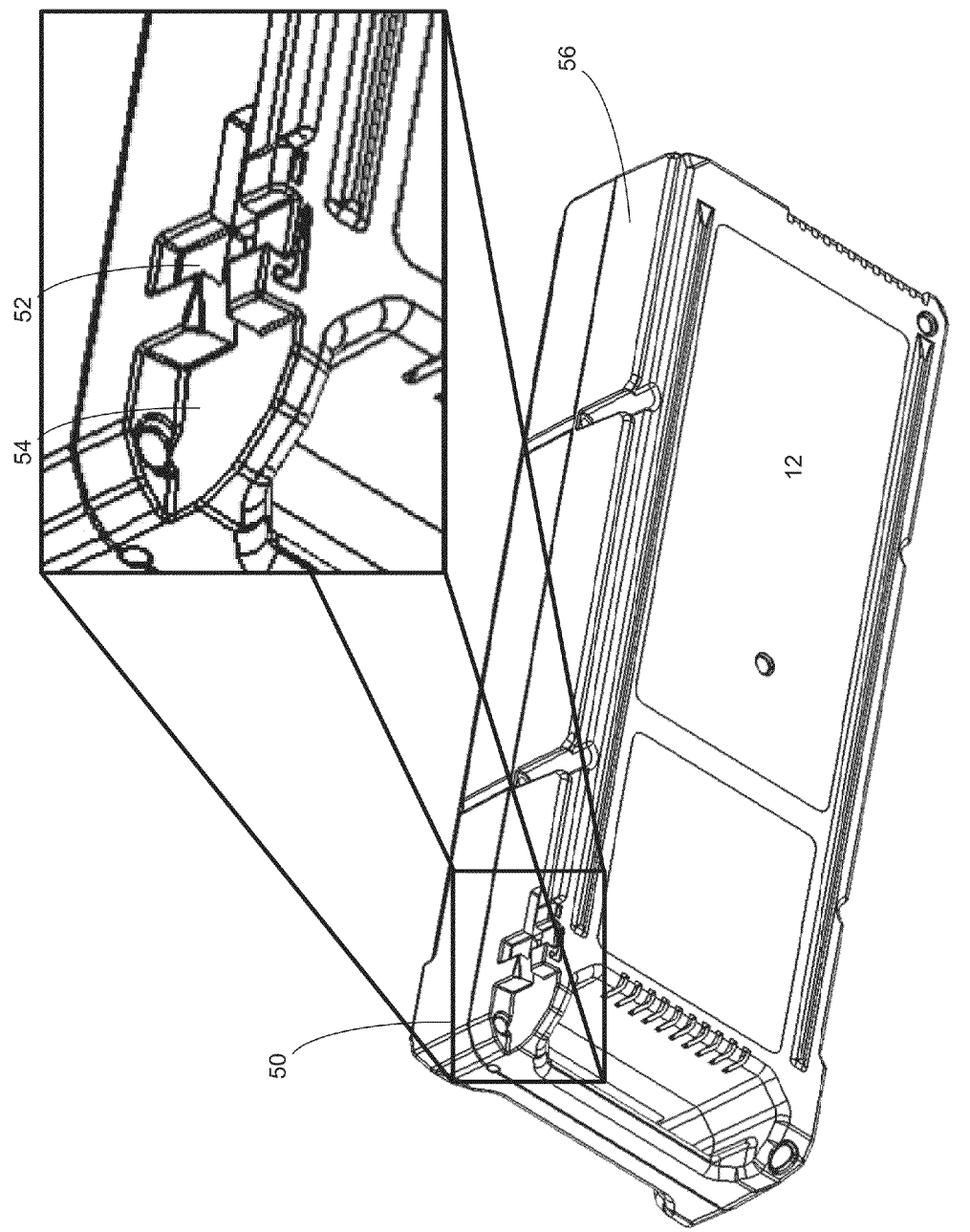
FIGS. 7-9 are detail views of a locking/indication system of the lockable infrastructure of FIG. 1.

Referring also to FIG. 7, locking/indication system 16 may include engagement channel 50, wherein engagement channel 50 includes a plurality of lockable engagement points (engagement points 52, 54). Engagement channel 50 may be incorporated into module assembly 12. Each of the lockable engagement points (engagement points 52, 54) may have a unique depth. For example, engagement point 54 is shown to be deeper than engagement point 52 (with respect to surface 56 of module assembly 12). Each of the lockable engagement points (engagement points 52, 54) may correspond to one of the above-referenced locked positions. Accordingly, engagement point 54 may correspond to Position A), wherein module assembly 12 is locked within frame assembly 14 (with electrical coupling). Further, engagement point 52 may correspond to Position B), wherein module assembly 12 is locked within frame assembly 14 (without electrical coupling).

Figure 8:
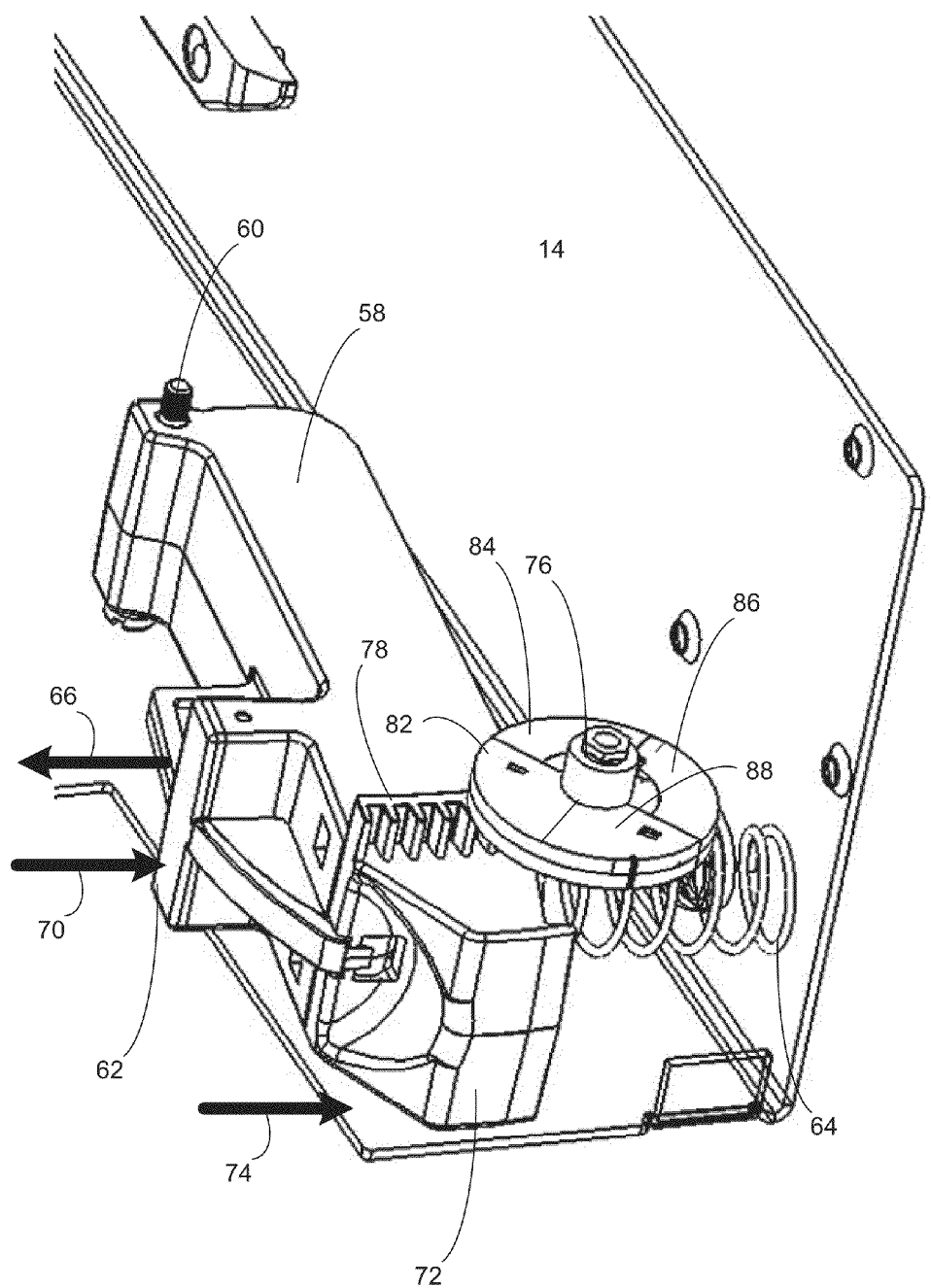
Figure 9:
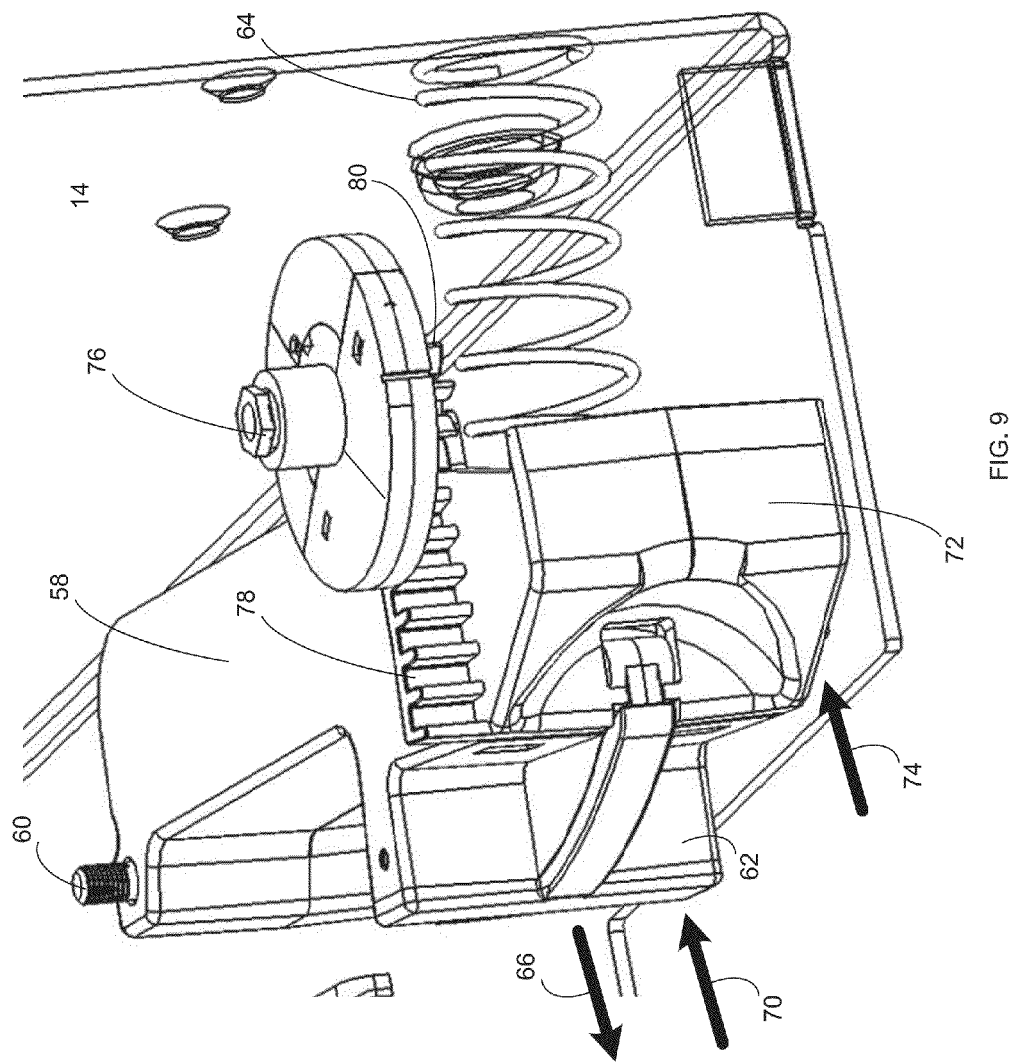

Referring also to FIGS. 8-9, locking/indication system 16 may include lever assembly 58, wherein lever assembly 58 is configured to releasably engage one or more of plurality of lockable engagement points (engagement points 52, 54). As discussed above, by selecting a particular locking position, a user of lockable infrastructure 10 may be able to select whether or not frame assembly 14 and module assembly 12 are electrically coupled when module assembly 12 is locked within frame assembly 14. Accordingly, by selecting which of the lockable engagement points (engagement points 52, 54) lever assembly 58 engages, the user of lockable infrastructure 10 may be able to select whether or not frame assembly 14 and module assembly 12 are electrically coupled when they are locked together.

Lever assembly 58 may be incorporated into frame assembly 14 and may be configured to pivot about pivot point 60. Lever assembly 58 may include protrusion 62 that is sized to be received by either of the engagement points (namely engagement point 52 and engagement point 54). The combination of the engagement point (either engagement point 52 or engagement point 54) and protrusion 62 may be configured in a manner to ensure positive engagement even when lockable infrastructure 10 is e.g. jostled during shipment. For example, protrusion 62 may be configured in the form of a dovetail and the engagement point into which protrusion 62 is positioned may have a complementary shape, thus reducing the chance of protrusion 62 "walking out of" the corresponding engagement point.

Locking/indication system 16 may include spring assembly 64 for biasing lever assembly 58. For example, spring assembly 64 may be configured to bias lever assembly 58 in the direction of arrow 66, thus biasing lever assembly 58 into one of engagement point 52 or engagement point 54. Accordingly, as module assembly 12 is slid into frame assembly 14 in the direction of arrow 68 (see FIG. 3), lever assembly 58 will be forced inward (in the direction of arrow 70) into frame assembly 14, thereby compressing spring assembly 64. This essentially complete compression of spring assembly 64 will continue until lever assembly 58 encounters engagement point 52. Upon encountering engagement point 52, lever assembly 58 will be allowed to move outward (in the direction of arrow 66) until protrusion 62 bottoms out in engagement point 52. At this point time and as discussed above, module assembly 12 will be locked in Position B), wherein module assembly 12 is locked within frame assembly 14 without module assembly 12 and frame assembly 14 being electrical coupled together. When in Position B, module assembly 12 did not travel far enough into frame assembly 14 for first portion 18 and second portion 20 of the electrical connector to engage each other.

Locking/indication system 16 may include release mechanism 72 that allows the user of lockable infrastructure 10 to disengaging lever assembly 58 from whichever lockable engagement points lever assembly 58 may be engaged with. For example, if a user wished to lock module assembly 12 in Position A (wherein module assembly 12 is locked and electrically coupled to frame assembly 14, the user would displace release mechanism 72 in the direction of arrow 74, thereby compressing spring assembly 64 and disengaging protrusion 62 from engagement point 52. The user may then be able to further slide module assembly 12 into frame assembly 14 in the direction of arrow 68 until module assembly 12 bottoms out in frame assembly 14. At this point in time, protrusion 62 will encounter engagement point 54 and lever assembly 58 will be allowed to move further outward (in the direction of arrow 66) until protrusion 62 bottoms out in engagement point 54. Module assembly 12 is now locked in Position A), wherein module assembly 12 is locked within and electrically coupled to frame assembly 14. When in Position A, module assembly 12 did travel far enough into frame assembly 14 for first portion 18 and second portion 20 of the electrical connector to engage each other.

Locking/indication system 16 may be configured to visually indicate the position of module assembly 12 within frame assembly 14. For example, locking/indication system 16 may be a color-based locking/indication system that is configured to visually indicate the position of module assembly 12 within the frame assembly 14 using a plurality of unique colors. Therefore, the color green may be utilized to indicate Position A), wherein module assembly 12 is locked within and electrically coupled to frame assembly 14. Further, the color yellow may be utilized to indicate Position B), wherein module assembly 12 is locked within frame assembly 14 without module assembly 12 and frame assembly 14 being electrical coupled together. Additionally, the color red may be utilized to indicate that module assembly 12 is not locked within frame assembly 14. For example and as discussed, when module assembly 12 is being slid into frame assembly 14, until protrusion 62 engages engagement point 52, lever assembly 58 will be forced inward (in the direction of arrow 70) into frame assembly 14, thereby compressing spring assembly 64. Accordingly, module assembly 12 will not be locked within frame assembly 14.

In order to display the above-described colors, locking/indication system 16 may include color wheel 76 that may be configured to visually indicate the plurality of unique colors. For example, lever assembly 58 may include rack gear 78 which is configured to mesh with pinion gear 80 (partially obscured) so that when lever assembly 58 is displaced in the direction of arrow 66, color wheel 76 rotates in a counter-clockwise direction and when lever assembly 58 is displaced in the direction of arrow 70, color wheel 76 rotates in a clockwise direction. As color wheel 76 may be visible through a window/passage within the front of lockable infrastructure 10, as color wheel 76 rotates, the color of color wheel 76 will change. This change in color will be visible through the above-described window/passage, thus providing the user of lockable infrastructure 10 with the above-described visual indication.

Each of the plurality of above-described locked positions may correspond to one of the plurality of unique colors. For example, assume for illustrative purposes that color wheel 76 is divided into four quadrants, namely red quadrant 82, yellow quadrant 84, green quadrant 86, and red quadrant 88. Assume for illustrative purposes that when module assembly 12 is initially being slid into frame assembly 14 and lever assembly 58 is forced inward (in the direction of arrow 70) into frame assembly 14, red quadrant 84 will be visible through the above-described window/passage. When protrusion 62 engages engagement point 52 (i.e., Position B), lever assembly 58 will be displaced in the direction of arrow 66, resulting in yellow quadrant 84 being visible through the above-described window/passage. Further, when protrusion 62 engages engagement point 54 (i.e. Position A), lever assembly 58 will be further displaced in the direction of our 66, resulting in green quadrant 86 being visible through the above-described window/passage. Additionally, lockable infrastructure 10 may be configured so that when module assembly 12 is fully removed from frame assembly 14, lever 58 is displaced a maximum amount in the direction of arrow 66, thus resulting in red quadrant 88 being visible within the above-described window/passage.

Having thus described the disclosure of the present application in detail and by reference to embodiments thereof, it will be apparent that modifications and variations are possible without departing from the scope of the disclosure defined in the appended claims.

What is claimed is:

1. A lockable infrastructure comprising:
   a frame assembly, including a first portion of an electrical connector, configured for use within an IT infrastructure, including at least one of an IT rack, an IT cabinet, and an IT enclosure;
   a module assembly, including a second portion of the electrical connector, configured to be removably positionable within the frame assembly; and
   a locking system configured to lock the module assembly within the frame assembly in one of a plurality of locked positions, wherein the locking system includes an engagement channel, wherein the engagement channel includes a plurality of lockable engagement points.

2. The lockable infrastructure of claim 1 wherein the first portion of the electrical connector is configured to releasably engage the second portion of the electrical connector and electrically couple the frame assembly to the module assembly when the module assembly is in a first of the plurality of locked positions.

3. The lockable infrastructure of claim 1 wherein the first portion of the electrical connector is configured to not releasably engage the second portion of the electrical connector and electrically isolate the frame assembly from the module assembly when the module assembly is in a second of the plurality of locked positions.

4. The lockable infrastructure of claim 1 wherein the frame assembly includes a portion of a standby power supply.

5. The lockable infrastructure of claim 4 wherein the module assembly includes a battery.

6. The lockable infrastructure of claim 1 wherein the engagement channel is incorporated into the module assembly.

7. The lockable infrastructure of claim 1 wherein each of the plurality of lockable engagement points has a unique depth.

8. The lockable infrastructure of claim 1 wherein the locking system includes a lever assembly, wherein the lever assembly is configured to releasably engage one or more of the plurality of lockable engagement points.

9. The lockable infrastructure of claim 8 wherein the lever assembly is incorporated into the frame assembly.

10. The lockable infrastructure of claim 8 wherein the locking system includes a spring assembly for biasing the lever assembly.

11. The lockable infrastructure of claim 8 wherein the locking system includes a release mechanism for disengaging the lever assembly from one or more of the plurality of lockable engagement points.

12. A lockable infrastructure comprising:
a frame assembly, including a first portion of an electrical connector, configured for use within an IT infrastructure, including at least one of an IT rack, an IT cabinet, and an IT enclosure;
a module assembly, including a second portion of the electrical connector, configured to be removably positionable within the frame assembly; and
a locking system configured to lock the module assembly within the frame assembly in one of a plurality of locked positions, wherein the locking system includes an engagement channel, wherein the engagement channel includes a plurality of lockable engagement points;
wherein the first portion of the electrical connector is configured to releasably engage the second portion of the electrical connector and electrically couple the frame assembly to the module assembly when the module assembly is in a first of the plurality of locked positions; and
wherein the first portion of the electrical connector is configured to not releasably engage the second portion of the electrical connector and electrically isolate the frame assembly from the module assembly when the module assembly is in a second of the plurality of locked positions.

13. The lockable infrastructure of claim 12 wherein the frame assembly includes a portion of a standby power supply.

14. The lockable infrastructure of claim 13 wherein the module assembly includes a battery.

15. A lockable infrastructure comprising:
a frame assembly, including a first portion of an electrical connector, configured for use within an IT infrastructure, including at least one of an IT rack, an IT cabinet, and an IT enclosure;
a module assembly, including a second portion of the electrical connector, configured to be removably positionable within the frame assembly; and
a locking system configured to lock the module assembly within the frame assembly in one of a plurality of locked positions;
wherein the locking system includes:
an engagement channel, wherein the engagement channel includes a plurality of lockable engagement points, and
a lever assembly, wherein the lever assembly is configured to releasably engage one or more of the plurality of lockable engagement points.

16. The lockable infrastructure of claim 15 wherein the engagement channel is incorporated into the module assembly.

17. The lockable infrastructure of claim 15 wherein each of the plurality of lockable engagement points has a unique depth.

18. The lockable infrastructure of claim 15 wherein the lever assembly is incorporated into the frame assembly.

19. The lockable infrastructure of claim 15 wherein the locking system includes a spring assembly for biasing the lever assembly.

20. The lockable infrastructure of claim 15 wherein the locking system includes a release mechanism for disengaging the lever assembly from one or more of the plurality of lockable engagement points.

\* \* \* \* \*